ULTRAHIGH-FREQUENCY TUNABLE STRUCTURE AND CIRCUIT

Filed Feb. 28, 1952

INVENTOR
WEN YUAN PAN
BY H. D. Newton
ATTORNEY

Patented Sept. 7, 1954 2,688,691

UNITED STATES PATENT OFFICE 2,688,691

ULTRAHIGH-FREQUENCY TUNABLE STRUCTURE AND CIRCUIT

Wen Yuan Pan, Collingswood, N. J., assignor to Radio Corporation of America, a corporation of Delaware Application February 28, 1952, Serial No. 274,035

11 Claims. (Cl. 250—20)

This invention relates generally to tunable resonant structures for selecting desired high-frequency waves, and particularly relates to a resonant structure suitable as a resonant signal selective circuit tunable over a relatively wide portion of the ultra high frequency (U. H. F.) range.

Recently the U. H. F. band from 470 to 890 megacycles (mc.) has been tentatively allocated for broadcasting television images. Tunable circuit structures in accordance with the invention are particularly adapted for tuning receivers to a selected television station broadcasting within the new U. H. F. band.

For any broadcast receiver adapted to receive signals within the new U. H. F. television band a tuner or tunable signal selective circuit is required between the antenna transmission line and the mixer stage or detector stage of the receiver. Such a tuner generally comprises two or more tunable resonant structures which are electrostatically and/or electromagnetically coupled. The pass band of the tuner is determined primarily by the extent of coupling between the several tunable structures. The tuner should have a sharp cut-off outside of the pass band to minimize various spurious responses. In addition, the losses caused by the tuner should be minimized. The losses include mismatch losses which occur whenever the impedances looking in both directions at the antenna transmission line terminals and the mixer or detector terminals are not conjugate matches. In other words a receiver tuner must not only provide the desired frequency response, but it must also act as a matching network between the antenna and detector impedances over a wide frequency range.

The tuner losses also include the resistive or dissipation losses in the tunable resonant structures. These losses may be indicated in terms of the Q of the structure which is a figure of merit and which may be defined as the ratio of the energy stored by the resonant circuit over the energy dissipated. The tuner should have a high Q over the entire frequency range. In addition, the tunable resonant structures should be adjustable over a relatively wide frequency tuning range, sufficient to substantially cover the entire U. H. F. television band. For use in a broadcast receiver, ease of manufacture and low cost are also of important considerations.

It is, accordingly, an object of the present invention to provide a resonant signal responsive structure tunable over a wide frequency tuning range, sufficient to cover the entire U. H. F. television band.

A further object of the invention is to provide a resonant structure providing a desired impedance match with the circuits coupled thereto over a wide frequency range as, for example, when the structure is tapped for connection to an antenna transmission line or to a U. H. F. mixer.

Another object of the invention is to provide a tunable resonant structure having a high circuit Q over a wide frequency range.

Still another object of the invention is to provide a tunable resonant structure of the character referred to which can be readily adapted to mass production at low cost.

The U. H. F. tunable resonant structure of this invention comprises an open circuited inductor having two portions and a conductive capacitance member serially connected between the portions of the inductor. A tuning element such as a metallic core is associated with the inductor and capacitance member to provide a capacitance between the inductor and the metallic core and between the capacitance member and the core. The tuning core is movable with respect to the capacitance member and the inductor so that at least one of the capacitances is varied upon relative movement of the tuning core. That end of the inductor to which the tuning core is adjacent remains open circuited or free. The other end of the inductor is electrically connected to the tuning element through a conductive or capacitive connection. The capacitive connection may include a conductive capacitance member similar to the member associated with the inductor. Input or output terminals are coupled between the inductor and the conductive connection which may be grounded.

As the tuning core is moved into the inductor, the capacitance between the inductor and the core is increased and the frequency at which the tunable structure resonates thereby decreases. It is well known that the frequency at which a circuit will resonate is inversely proportional to the square root of the product of the inductance and capacitance in the circuit. By providing a conductive capacitance member intermediate the ends of the inductor of the tunable structure in accordance with the invention, as will hereinafter be more fully explained, the amount of capacitance in circuit with the structure is increased at the low frequency end of the tuning range and the over-all tuning range of the structure thereby extended.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
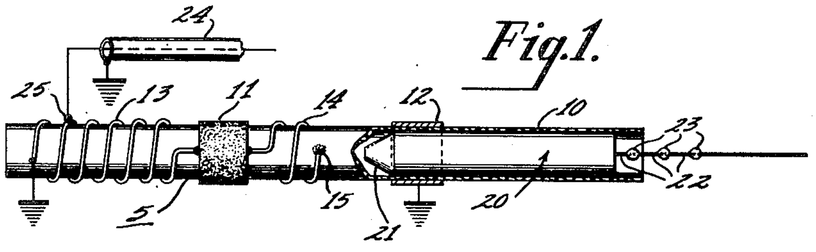
Figure 1 is a plan view with a portion cut away of a resonant structure embodying the present invention and schematic circuit connections thereto.

Referring now to the drawing and particularly to Figure 1 there is illustrated a tunable resonant structure 5 which includes a hollow cylinder or tube 10 consisting of a material having a high dielectric constant such, for example, as a ceramic material or glass. Preferably tube 10 consists of glass which may readily be manufactured with a high dielectric constant and with a wall thickness which can be maintained within close tolerances in mass production.

A pair of conductive capacitance members 11 and 12 is provided on the outside of glass tubing 10. The capacitance members 11, 12 consist of a conductor such, for example, as copper or silver and may be coated to provide sleeves disposed about the circumference of the glass tubing 10. A pair of inductors or coils 13 and 14 is electrically connected to the coating 11. The inductors may, for example, consist of a wire of a suitable metal such as copper or brass wound on the glass tubing 10, or they may consist of a coating of metal which has been placed on the tubing.

A movable conductive tuning element 20 cooperates with the capacitance members or coatings 11, 12 and the inductors 13, 14. As shown in the drawing, the tuning element may take the form of a metallic core 20 which has one extreme position where it extends within both coatings 11, 12. The tuning core 20 may be provided with a tapered end portion 21 to provide a predetermined relationship between the movement of the tuning core 20 and the resulting variation of the resonant frequency of the resonant structure 5. The tuning core 20 may be moved by the means of wires 22 which are electrically insulated from each other by glass beads 23 in the manner disclosed and claimed in the copending application to T. Murakami, filed February 2, 1950, Serial No. 142,013 and now Patent No. 2,601,445 issued on June 24, 1952 assigned to the assignee of this application.

It will, accordingly, be seen that the capacitance between coating 11 and core 20 and between inductors 13, 14 and core 20 varies upon movement of the tuning core. On the other hand, the capacitance provided between coating 12 and core 20 remains substantially constant upon movement of the tuning core. In addition, movement of the tuning core varies the inductance of inductors 13 and 14. As a result, there is provided a resonant structure in which the inductance and capacitance are simultaneously varied. It has been found that the resonant structure of the invention is tunable from a frequency lower than 300 mc. to a frequency higher than 900 mc. The resonant frequency of the structure of the invention as a function of the percentage of the tuning core stroke is shown by curve 30 in Figure 2.

An input circuit which may, for example, be an antenna is coupled through a transmission line 24 between the inductor 13 and the common or ground terminal. For the purpose of matching the input impedance of the resonant structure to the impedance of the transmission line the inner conductor of the transmission line 24 is tapped or connected to an intermediate point 25 of the inductor 13, while the outer conductor of the transmission line may be grounded.

To obtain optimum matching between the input circuit and the tunable structure, the ratio of the input circuit impedance to the impedance of the tunable structure at resonance should be a definite function of the ratio of the inductance of the tunable structure to the inductance in circuit between the tapping point 25 and ground. However, since the impedance of the tunable structure at resonance varies with the freqnant frequency, the inductance of the tunable structure must also vary with frequency to maintain the aforementioned proportionality. The tunable structure in accordance with the invention approximately satisfies this requirement in that the inductance and capacitance of the structure are simultaneously adjusted as the structure is tuned. Proper matching is therefore provided between the input circuit and the tunable structure over a relatively wide frequency range.

A further tapping point may be provided intermediate the inductor 13 and an output circuit connected between the further tapping point and ground.

Figures 2, 3:
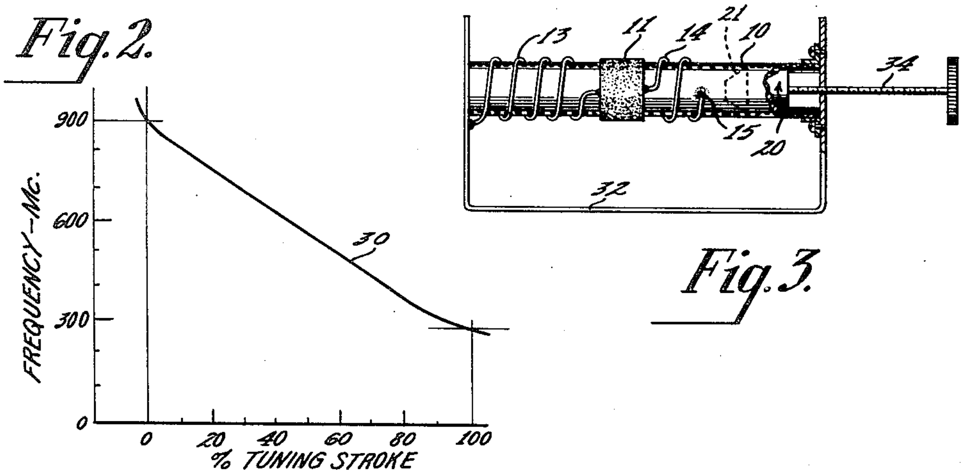
Figure 2 is a graph illustrating the frequency at which the resonant structure of Figure 1 resonates as a function of percentage tuning stroke.
Figure 3 is a plan view with a portion cut away of a further embodiment of a resonant structure in accordance with the present invention.

In Figure 3 there is provided, in accordance with the invention, a conductive enclosure or shield 32 within which the glass tubing 10 of the resonant structure 5 is supported. The shield provides a direct electrical connection between the inductor 13 and the core 20. In accordance with the modification of the invention shown in Figure 3 the tuning core 20 is moved by means of a threaded conductive shaft 34. By directly connecting the core 20 through the shaft 34 and the shield 32 to the inductor 13 as illustrated in Figure 3 the conductive capacitance member 12 may be eliminated from the structure.

Figure 4:
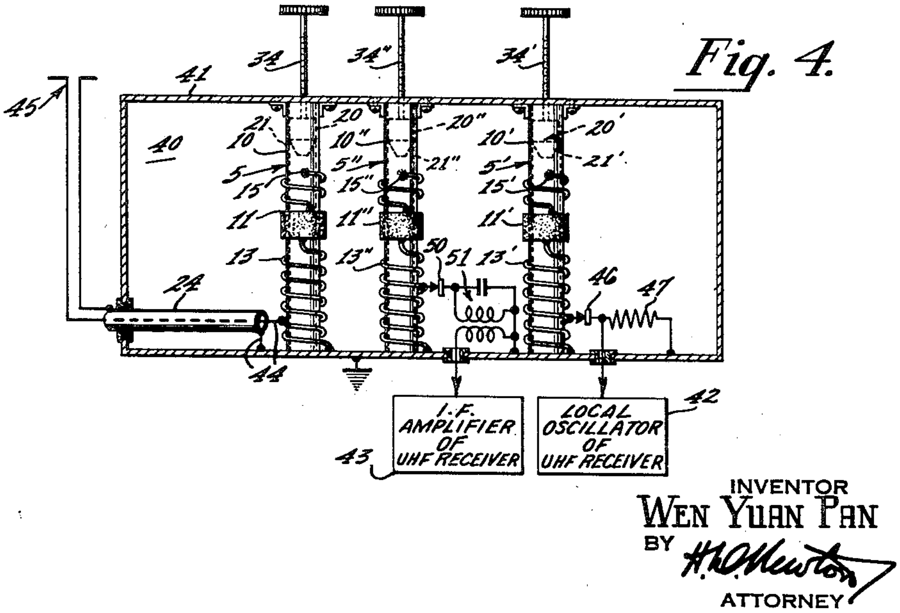
Figure 4 is a front elevational view, partly sectionalized, of an ultra high frequency pre-selector embodying the present invention and schematic circuits connected thereto.

In Figure 4 there is illustrated a U. H. F. tuner unit 40 including three tunable structures in accordance with the invention enclosed in a conductive casing 41 such for example, as a copper shield. The unit 40 may be tuned within a desired frequency band in the U. H. F. range and forms a part of the U. H. F. television signal receiver. The U. H. F. receiver may also include, for example, a source of local oscillations diagrammatically represented at 42 and an intermediate frequency (I. F.) signal amplifier diagrammatically represented at 43. The tunable structures 5 and 5'' are electromagnetically and electrostatically coupled to each other as will hereinafter be explained. The structures 5, 5' and 5'' are each similar to the structure of Figure 3. The received modulated carrier waves and the local heterodyning waves being energized and in the structure 5' are both coupled to the crystal rectifier 50, from which the desired intermediate wave is obtained.

The preselector or first tunable structure 5 of the unit is provided with input terminals 44 connected with a suitable signal source, such as a dipole antenna 45, for intercepting picture modulated carrier waves over a relatively wide frequency band. Received signals are conveyed from the dipole through a transmission line 24.

For the purpose of matching the input impedance of the structure 5 to the impedance of the transmission line, an intermediate point of inductor 13 may be connected to one conductor of the transmission line, while the other conductor of the line may be connected to the shield 41 which is grounded.

In order that the local oscillator 42 can cover a much wider signal range, the local oscillator may be operated at a frequency equal to one half or one third of the frequency required to heterodyne with the intercepted modulated carrier wave in producing the intermediate frequency wave. The local oscillator is coupled to a crystal rectifier 46 such, for example, as a 1N34A type crystal rectifier wherein harmonics of the local oscillator frequency are developed. A resistor 47 connected in circuit between the rectifier 46 and ground provides a direct current return path for the oscillator currents.

Harmonics of the oscillator frequency are fed through the rectifier 46 to the tunable structure 5′ which may be resonant to the second or third harmonic of the oscillator frequency depending on the frequency of the local oscillations and the desired intermediate frequency.

The impedance of the rectifier 46 which at ultra high frequencies is substantially constant with constant excitation power may be matched to the input impedance of the tunable structure 5′ by connecting the rectifier to an intermediate point on inductor 13′.

The received modulated carrier wave selected by the structure 5 and the wave having a frequency equal to a desired harmonic frequency of the local oscillations selected by the structure 5′ are electromagnetically and electrostatically coupled to the structure 5″.

The oscillations induced in the tunable structure 5″ are mixed in the crystal rectifier 50 which may be of the 1N72 type and which is connected to and derives output currents from the inductor 13″ of the structure 5″. Proper impedance matching between the crystal and the tunable structure is obtained by connecting the crystal to an intermediate point on the inductor 13″. A tuned signal selective circuit 51 such, for example, as an intermediate frequency transformer and an associated capacitor is connected in circuit between the crystal mixer 50 and ground. The tuned circuit 51 selects the desired intermediate frequency wave from the waves developed in the crystal mixer and inductively transfers the selected wave to a suitable utilizing circuit such as the I. F. amplifier 43. The I. F. waves may be further amplified and detected, and the modulation signals thereon recovered and detected in conventional circuits which, not being a part of the invention, are not illustrated.

There has thus been illustrated and described a tunable ultra high frequency signal selective structure and circuit which may be tuned over a relatively wide frequency band in the U. H. F. range. The structure provides for proper impedance matching over a wide frequency range when tapped for connection to a transmission line or utilizing means. Consequently the Q of the circuit is high over a wide frequency range. The structure is well adapted for mass production and may be manufactured at low cost.

What is claimed is:

1. A tunable resonant structure for ultra high frequency signal circuits comprising an open-circuited inductor having a first and second portion, a conductive capacitance member serially connected between said inductor portions, a single conductive tuning element associated with said inductor and with said capacitance member to provide a capacitance between said inductor and said tuning element and between said capacitance member and said tuning element, said tuning element being movable with respect to and along said inductor and said capacitance member to vary said capacitances upon relative movement of said tuning element, and a circuit connection between said tuning element and one end of said inductor.

2. The combination as defined in claim 1, wherein the connection between said tuning element and said one end of the inductor includes a second conductive capacitance member.

3. A tunable resonant structure for ultra high frequency signal circuits comprising an open-circuited inductor having a first and second portion, a metallic capacitance member serially connected between said inductor portions, a metallic tuning core associated with said inductor and with said member to provide a capacitance between said inductor and said core and between said member and said core, said core being movable with respect to said inductor and said member to vary said capacitances upon relative movement of said core, a circuit connection between said core and one end of said inductor, and a pair of terminals coupled to an intermediate point on said inductor and to said circuit connection.

4. A tunable resonant structure for ultra high frequency signal circuits comprising an open-circuited inductor having a first and second portion, a first conductive capacitance member serially connected between said portions of said inductor, a second conductive capacitance member spaced and electrically insulated from one end of said inductor, a conductive tuning element associated with said inductor and said capacitance members to provide a capacitance between said inductor and said tuning element and each of said capacitance members and said tuning element, said tuning element being movable with respect to said inductor and said members and electrically insulated therefrom to vary at least one of said capacitances upon relative movement of said tuning element, and a conductive connection between said second capacitance member and the other end of said inductor.

5. A tunable resonant structure for ultra high frequency signal circuits comprising a tube of a material having a high dielectric constant, a pair of conductive coatings provided on the outside of said tube and spaced from each other, an open-circuited inductor having a first and second portion provided on said tube, one of said coatings serially connected between said portions of said inductor, a tuning core slidable in said tube and cooperating with said coatings to provide individual capacitances between each coating and said core and between said inductor and said core, said core being shaped to vary in a predetermined relationship the capacitance formed between said core and said inductor and between said core and said one of said coatings upon relative movement of said core and a conductive connection between one end of said inductor and the other one of said coatings.

6. A tunable resonant structure for ultra high frequency signal circuits comprising a tube of a material having a high dielectric constant, a conductive coating provided on the outside of said tube, an inductor provided on said tube, said inductor connected with and extending beyond said coating in either direction along said tube, a core slideable in said tube and cooperating with said coating and with said inductor to provide individual capacitances between said coating and said core and between said inductor and said core, and a conductive connection between one end of said inductor and said core.

7. The combination as defined in claim 6 wherein said core assembly is shaped to vary the capacitance between said core and said inductor and between said core and said coating in a predetermined relationship.

8. The combination as defined in claim 6 wherein a pair of terminals is coupled between an intermediate point of said inductor and said conductive connection.

9. In an ultra high frequency tuner the combination of a plurality of tunable resonant structures electrostatically and electromagnetically coupled; each of said structures including an open circuited inductor having a first and second portion, a conductive capacitance member serially connected between said inductor portions, a conductive tuning element associated with said inductor and with said member to provide a capacitance between said inductor and said core and between said member and said core, said core being movable with respect to said inductor and said member to vary said capacitances upon relative movement of said core, and a conductive connection between said core and one portion of said inductor; a source of modulated carrier waves coupled to one of said structures, a source of local oscillations coupled to another one of said structures, and a utilization circuit coupled to a further one of said structures.

10. In an ultra high frequency tuner the combination as defined in claim 9 wherein said another one of said structures is resonant to a frequency equal to a multiple of the frequency of said local oscillations.

11. In an ultra high frequency tuner the combination as defined in claim 9 wherein said utilization circuit is resonant to a frequency equal to the difference between the frequency of said carrier waves and a multiple of the frequency of said local oscillations.

References Cited in the file of this patent

UNITED STATES PATENTS

| Number | Name | Date |
|---|---|---|
| 1,538,466 | Cohen et al. | May 19, 1925 |
| 1,977,271 | Giddens | Oct. 16, 1934 |
| 2,106,226 | Schaper | Jan. 25, 1938 |
| 2,259,003 | Reid | Oct. 14, 1941 |
| 2,469,168 | Loughlin | May 3, 1949 |